(12) United States Patent
Hauschild

(10) Patent No.: US 7,502,097 B2
(45) Date of Patent: Mar. 10, 2009

(54) METHOD AND EXPOSURE APPARATUS FOR PERFORMING A TILTED FOCUS AND A DEVICE MANUFACTURED ACCORDINGLY

(75) Inventor: Jan Hauschild, Eindhoven (NL)

(73) Assignee: ASML Netherlands B.V., Veldhoven (NL)

( * ) Notice: Subject to any disclaimer, the term of this patent is extended or adjusted under 35 U.S.C. 154(b) by 596 days.

(21) Appl. No.: 11/270,826

(22) Filed: Nov. 10, 2005

(65) Prior Publication Data

US 2006/0146302 A1    Jul. 6, 2006

Related U.S. Application Data

(63) Continuation-in-part of application No. 11/020,557, filed on Dec. 27, 2004.

(60) Provisional application No. 60/684,951, filed on May 27, 2005.

(51) Int. Cl.
  G03B 27/52   (2006.01)
  G03B 27/42   (2006.01)
  G03B 27/32   (2006.01)

(52) U.S. Cl. ............... 355/55; 355/53; 355/77

(58) Field of Classification Search ........... 355/53, 355/55, 77, 52; 356/620, 624; 250/548, 250/559.29
See application file for complete search history.

(56) References Cited

U.S. PATENT DOCUMENTS 6,710,853 B1    3/2004   La Fontaine et al.
6,813,000 B1 *  11/2004  Nishi ................... 355/53
2002/0015158 A1  2/2002  Shiode et al.
2002/0100012 A1  7/2002  Sutani et al.
2004/0001192 A1 *  1/2004  Lyons et al. ........... 355/55
2004/0263810 A1 * 12/2004  Kirchner et al. ....... 355/52

FOREIGN PATENT DOCUMENTS

EP    1 057 079 B1   12/2000
EP    1 223 468 A1    7/2002

* cited by examiner

*Primary Examiner*—Alan A Mathews
(74) *Attorney, Agent, or Firm*—Pillsbury Winthrop Shaw Pittman LLP

(57) ABSTRACT

The invention is directed to a method for performing a tilted focus test that includes providing a target object, providing a projection beam of radiation using a radiation source, providing at least one reflective device to produce a projected projection beam of radiation onto the target portion, and producing a first projected projection beam of radiation onto the target object using the at least one reflective device in a first orientation. The invention further includes using a tilting device for tilting the at least one reflective device to a second orientation to provide a second projection beam with a tilt relative to said first projection beam, producing a second projected projection beam of radiation onto the target object, determining a lateral shift of the first and second projected projection beams on the target object, and determining from said lateral shift a defocus of the target object with respect to the projected projection beam.

21 Claims, 8 Drawing Sheets

METHOD AND EXPOSURE APPARATUS FOR PERFORMING A TILTED FOCUS AND A DEVICE MANUFACTURED ACCORDINGLY

RELATED APPLICATIONS

This Application claims priority to U.S. Provisional Application No. 60/684,951, filed May 27, 2005, and is a continuation-in-part of U.S. application Ser. No. 11/020,557, filed Dec. 27, 2004, the entire contents of each are hereby incorporated by reference.

FIELD OF THE INVENTION

The present invention relates to a method for performing a tilted focus test. The invention further relates to an exposure apparatus and a device manufactured accordingly.

BACKGROUND OF THE INVENTION

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. comprising part of, one, or several dies) on a substrate (e.g. a silicon wafer). Transfer of the pattern is typically performed via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

In order to image the pattern, via the lens, to the substrate, the layer of resist provided on the substrate should be in the focal plane of the projection system. Focus tests have been developed to test if the substrate is positioned correctly, in which a test pattern provided by a test device is imaged on the layer of resist. Next, a latent image of the test pattern is made visible by performing, for instance, a post exposure bake. After this, the width of for instance a line of the created pattern could be measured using for instance a scanning electron microscope. By comparing this width with a previously obtained calibration graph (bossung curve) the defocus can be determined. It will be understood that the width of a line is minimal in the best focus position and will become larger with increasing defocus.

In some places this text refers to positioning the substrate in the focal plane of the projection system. It is understood that this should be read as positioning the layer of resist provided on the substrate in the focal plane of the projection system.

However, in telecentric focus tests, it is only possible to determine the absolute defocus, but not the relative defocus. The absolute defocus is the distance between the layer of resist and the focal plane, but does not provide information whether the resist is above or below the focal plane, i.e. the sign of the defocus can not be determined. The relative defocus is the distance between the layer of resist and the focal plane including the sign of the defocus. The relative defocus also provides information about whether the resist is above or below the focal plane. Telecentric focus tests only provide information about the absolute defocus and do not provide sufficient information for correcting the position of a substrate with respect to the projection system, since the sign of the absolute defocus is not known.

Therefore, tilted focus tests have been developed. In such tilted focus tests, an image of the test pattern is projected under an angle, such that defocus not only results in a blurred image of a test device, but also in a lateral shift of the position of the imaged test device. Such tilted focus tests use devices to create a tilted beam, such as a wedge that is translucent for the light used, or a transmissive test device provided with a pattern that creates a diffraction pattern in which e.g. the minus one diffraction order is cancelled out. These known techniques are discussed in more detail below, with reference to FIGS. 2a, 2b, 3a, 3b, 4 and 5.

In order to manufacture increasingly smaller lithographic devices having increasingly smaller dimensions, the wavelength of the used radiation is preferably chosen as small as possible. The use of extreme ultraviolet radiation, e.g. in a range of 5-20 nm, would therefore offer great advantages. It is however known that radiation having a relatively small wavelength, such as EUV radiation, does not easily penetrate through matter. Therefore, the prior art solutions described above and below with reference to FIGS. 2a, 2b, 3a, 3b, 4 and 5 to create a tilted beam cannot be used for EUV radiation. In principal it is possible to manufacture a reflective version of the known transmissive test devices provided with a pattern, however, this requires an accuracy that is difficult to obtain these days, as will be further explained below.

US2002/0015158 A1 discloses a method of detecting focus information based on illumination rays having different main ray incidence directions, which means that the projection beam is tilted. Images of marks are projected through an optical system. A blocking member is provided in the illumination system that can be positioned in the light beam. The blocking member is provided with an aperture to partially block the light beam in such a way that a tilted beam is generated.

In order to determine the lateral shift of the projected mark images with respect to a mark image projected using a non tilted beam, a reference is needed. According to US2002/0015158 A1, this is achieved by superimposing a first and a second image of a single mark on the reticle. The mark is first projected on a substrate using a tilted beam, and next, another projection is performed on the substrate using a non tilted beam superimposed on the previous one. In between the first and second projections, the blocking member is removed from the light path. The lateral shift is given by the mutual distance between the first and second projected marks on the substrate.

According to a further embodiment of US2002/0015158 A1, a first exposure is carried out using a first blocking member, and a second exposure is carried out using a second blocking member, where the first and second blocking members have an aperture that are opposite to each other, such that the tilts of the first and second exposure are opposite to each other and thus the sensitivity of the measurement method is doubled.

The tilted focus test as disclosed in US2002/0015158 A1 has, however, some disadvantages. Firstly the blocking member must be specially designed to take into account the relative position of the marks on the reticle. This means that a blocking member needs to be designed in dependence on the relative position of the mark on the reticle.

Secondly, according to US2002/0015158 A1. double exposure is needed to provide a reference, in between which the blocking member needs to be removed or replaced with another (opposite) blocking member. Therefore, this is a time-consuming procedure that reduces the throughput of the system.

US2002/0100012 A1 describes several ways to create a tilted beam for use in a tilted focus test. A tilted beam is obtained by blocking certain diffraction orders. The blocking can for instance be achieved by positioning a pellicle under the mask. A frame member holding the pellicle is then used to block a diffraction order of the mark. According to an alternative, part of the normally transparent part of the pellicle can be non-transparent, to block certain diffraction orders.

The options presented in US2002/0100012 have several disadvantages. Using the frame member to create a tilted beam is rather cumbersome, and can only be used if the angle under which the diffraction orders are emitted by the mark and the distance between the frame member and the mark are within certain limits with respect to each other. Using the normally translucent pellicle to block certain diffraction orders requires a specially adapted pellicle for each mark. The overall performance of the pellicle will decrease, as a result of the non-transparent parts, having a negative effect on the over-all performance of the system. Also, pellicles can not be used in applications using (extreme) ultraviolet radiation beams, as will be understood by a skilled person.

The present invention provides a lithographic apparatus that overcomes at least one of the above mentioned problems. The invention further provides a lithographic apparatus that could be used in combination with (E)UV radiation.

SUMMARY

According to an aspect of the invention, there is provided a method of performing a tilted focus test that includes:

providing a target object;

providing a projection beam of radiation using a radiation source;

producing a first projected projection beam of radiation onto the target object using a first reflective device in a first orientation, producing a second projected projection beam of radiation onto the target object using a second reflective device in a second orientation having a tilt with respect to the first orientation, determining a lateral shift of the first and second projected projection beams on the target object and determining from said lateral shift a defocus of the target object with respect to the first and second projected projection beam.

According to a further aspect, the invention relates to an exposure apparatus that includes:

a table for holding a target object;

a radiation source to provide a projection beam of radiation;

a first reflective device in a first orientation to produce a first projected projection beam of radiation onto the target portion;

a second reflective device in a second orientation to produce a second projected projection beam of radiation onto the target portion, the second orientation having a tilt with respect to the first orientation and the second projected projection beam being tilted with respect to the first projected projection beam of radiation;

the exposure apparatus further comprising an electronic control unit to control the exposure apparatus to determine a lateral shift of the first and second projected projection beams on the target object and to determine from said lateral shift a defocus of the target object with respect to the projected projection beam.

SHORT DESCRIPTION OF THE DRAWINGS

Embodiments of the invention will now be described, by way of example only, with reference to the accompanying schematic drawings in which corresponding reference symbols indicate corresponding parts, and in which.

Figure 6:
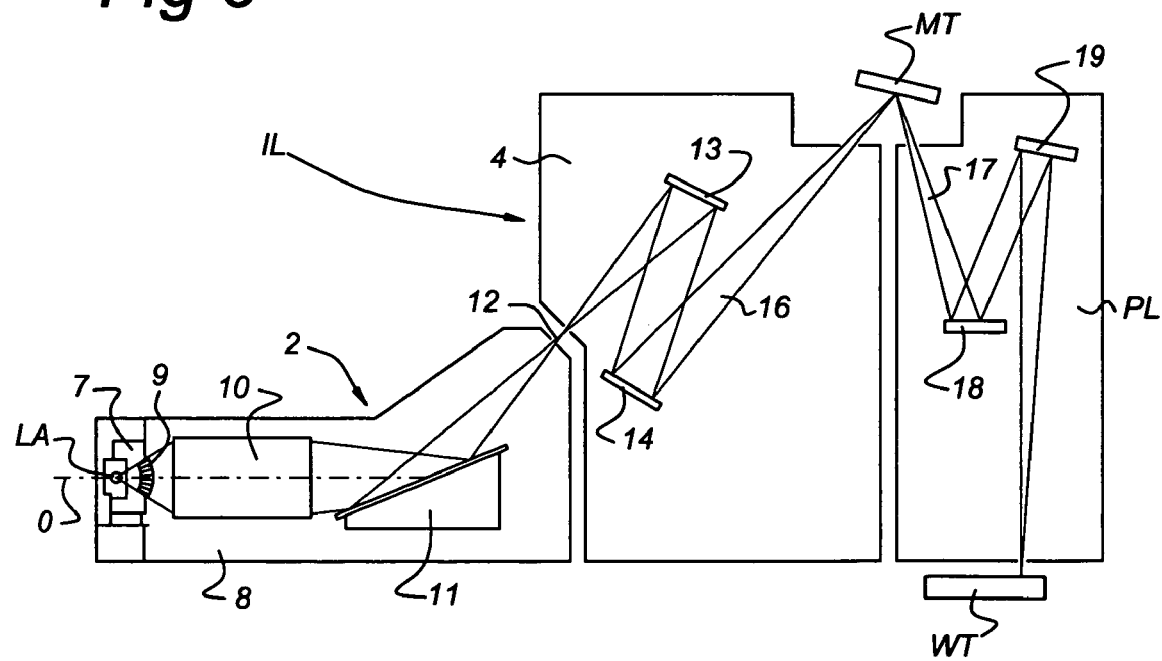
Figure 7A:
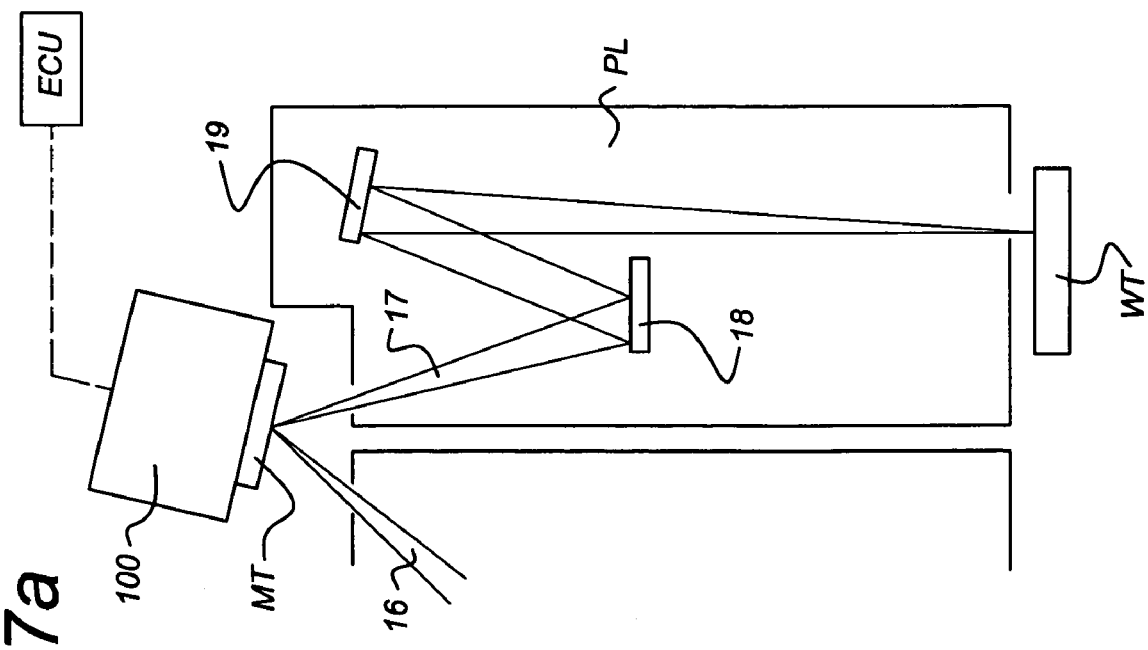
Figure 7B:
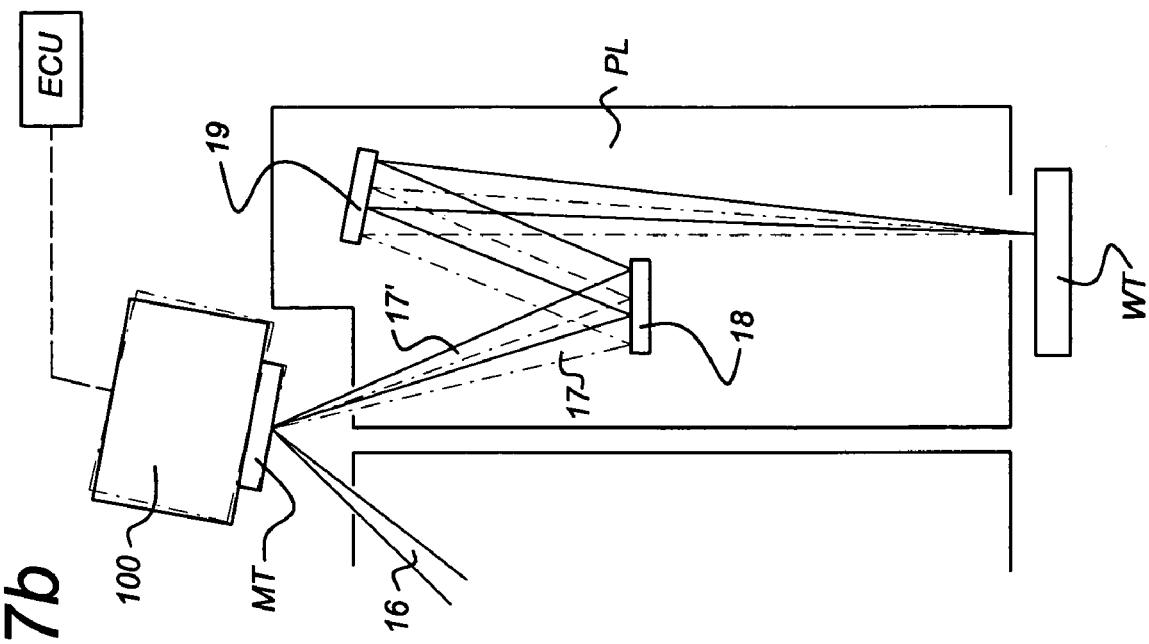
Figure 9:
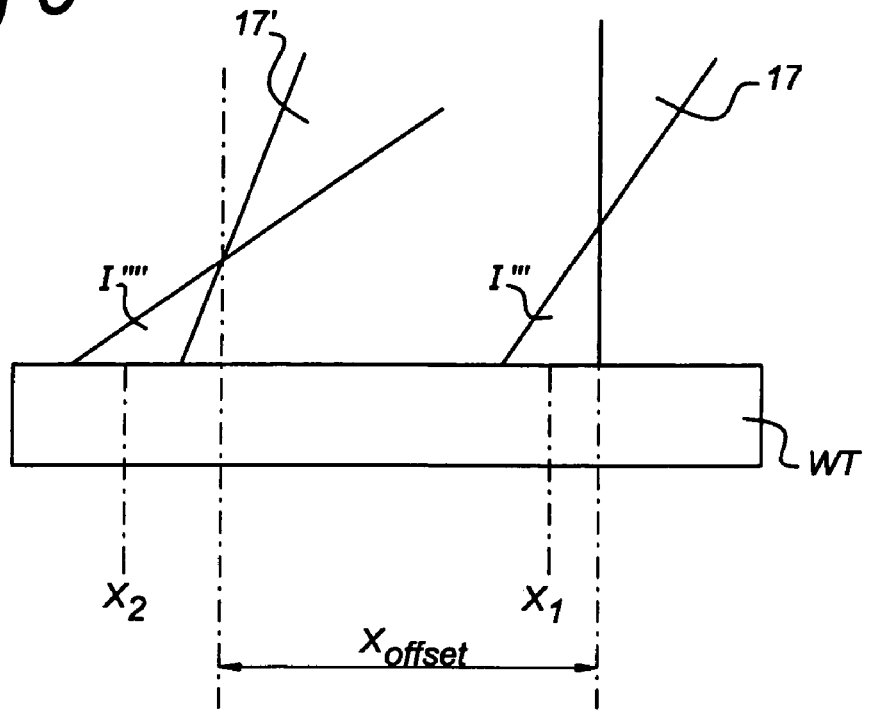
Figure 10:
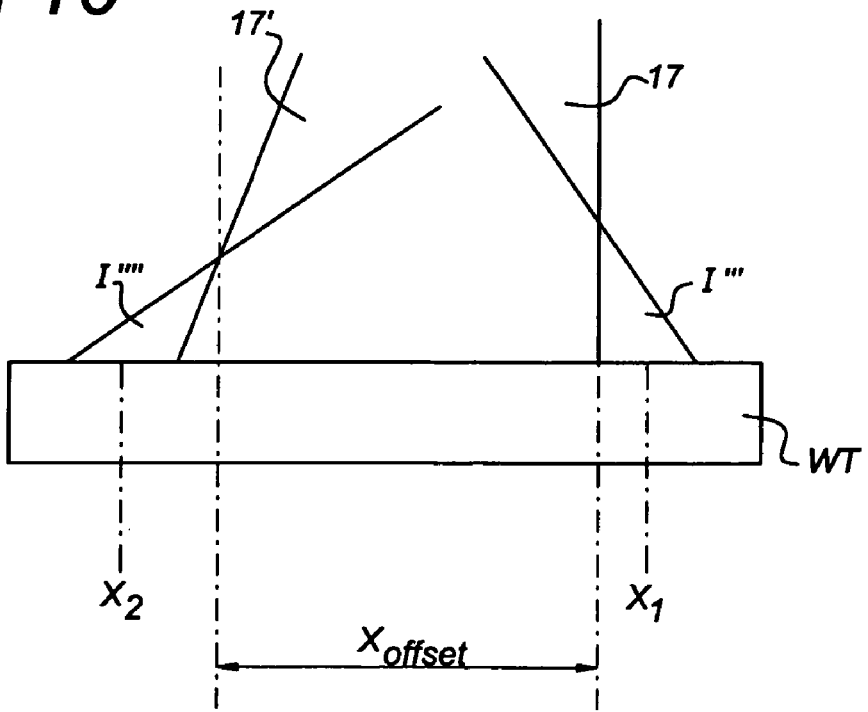
Figure 11:
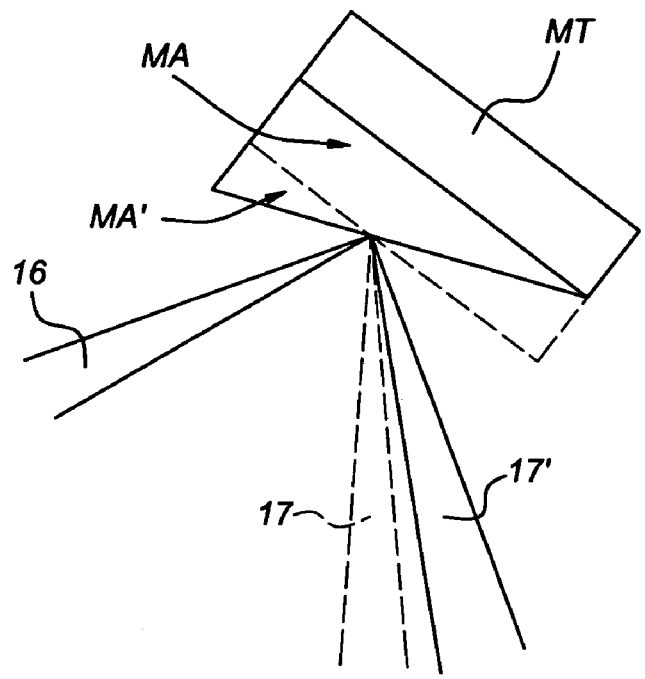
Figure 12:
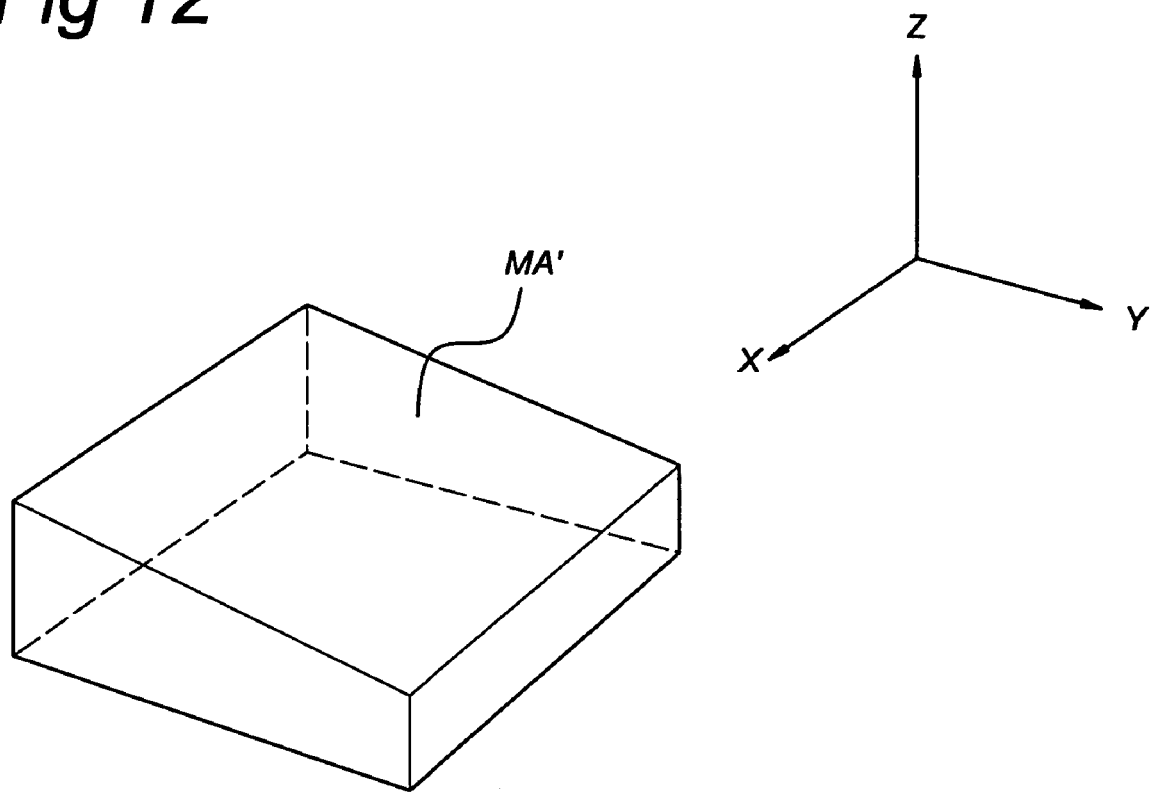
Figure 13:
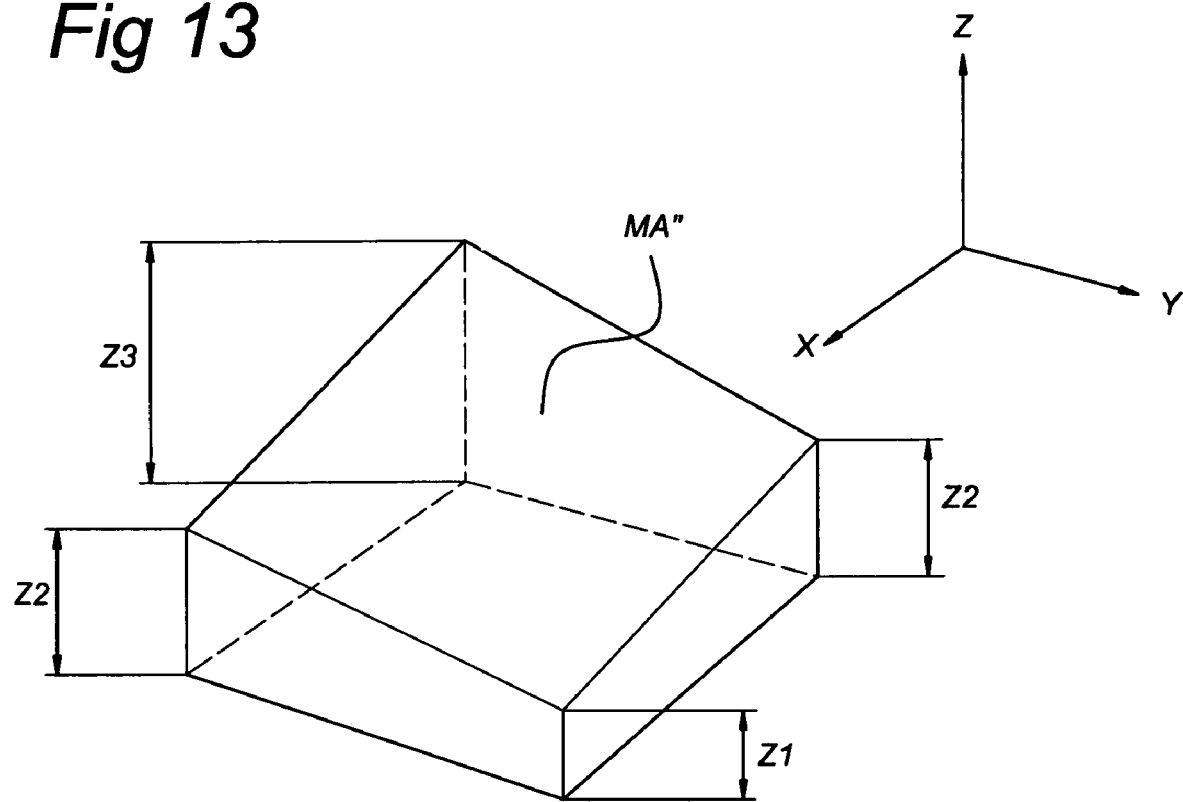

FIG. 6 provides a detailed view of a lithographic apparatus;

FIGS. 7a and 7b depict a lithographic apparatus according to an embodiment of the invention;

FIGS. 8a, 8b, 8c and 8d depict an embodiment of the invention;

FIG. 9 depicts an alternative embodiment of the invention;

FIG. 10 depicts an alternative embodiment of the invention;

FIG. 11 depicts a lithographic apparatus according to a further embodiment of the invention, FIG. 12 depicts a reflective device according to a further embodiment of the invention, and FIG. 13 depicts a reflective device according to a further embodiment of the invention.

DETAILED DESCRIPTION

Figure 1:
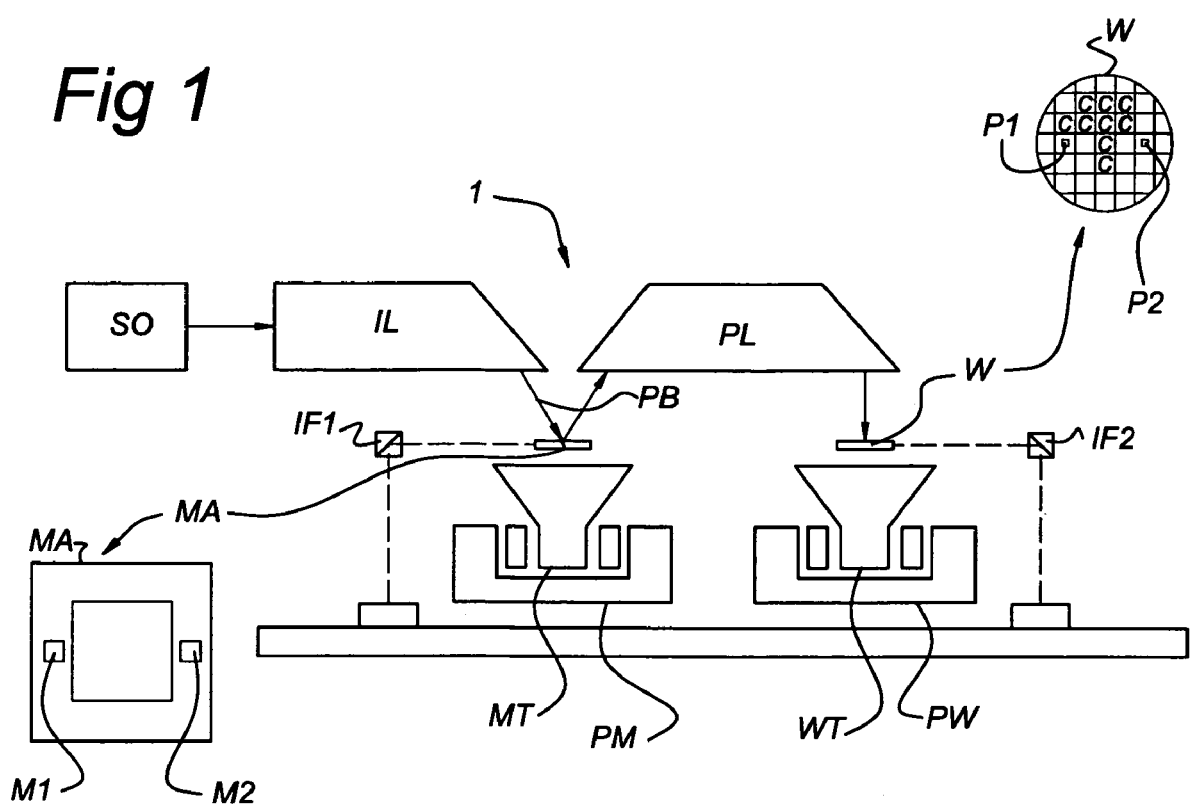
FIG. 1 depicts a lithographic apparatus.

FIG. 1 schematically depicts a lithographic apparatus according to one embodiment of the invention. The apparatus comprises:

an illumination system (illuminator) IL configured to condition a radiation beam B (e.g. UV radiation or EUV radiation).

a support structure (e.g. a mask table) MT constructed to support a patterning device (e.g. a mask) MA and connected to a first positioner PM configured to accurately position the patterning device in accordance with certain parameters;

a substrate table (e.g. a wafer table) WT constructed to hold a substrate (e.g. a resist-coated wafer) W and connected to a second positioner PW configured to accurately position the substrate in accordance with certain parameters; and a projection system (e.g. a refractive projection lens system) PL configured to project a pattern imparted to the radiation beam B by patterning device MA onto a target portion C (e.g. comprising one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure supports, i.e. bears the weight of, the patterning device. It holds the patterning device in a manner that depends on the orientation of the patterning device, the design of the lithographic apparatus, and other conditions, such as for example whether or not the patterning device is held in a vacuum environment. The support structure can use mechanical, vacuum, electrostatic or other clamping techniques to hold the patterning device. The support structure may be a frame or a table, for example, which may be fixed or movable as required. The support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system."

As here depicted, the apparatus is of a reflective type (e.g. employing a reflective mask). Alternatively, the apparatus may be of a transmissive type (e.g. employing a transmissive mask).

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

The lithographic apparatus may also be of a type wherein at least a portion of the substrate may be covered by a liquid having a relatively high refractive index, e.g. water, so as to fill a space between the projection system and the substrate. An immersion liquid may also be applied to other spaces, in the lithographic apparatus, for example, between the mask and the projection system. Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD comprising, for example, suitable directing mirrors and/or a beam expander. In other cases the source may be an integral part of the lithographic apparatus, for example when the source is a mercury lamp. The source SO and the illuminator IL, together with the beam delivery system BD, if needed, may be referred to as a radiation system.

The illuminator IL may comprise an adjuster AD for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as an integrator IN and a condenser CO. The illuminator may be used to condition the radiation beam, to have a desired uniformity and intensity distribution in its cross-section.

The radiation beam PB is incident on the patterning device (e.g., mask MA), which is held on the support structure (e.g., mask table MT), and is patterned by the patterning device. Having traversed the mask MA, the radiation beam PB passes through the projection system PL, which focuses the beam onto a target portion C of the substrate W. With the aid of the second positioner PW and position sensor IF2 (e.g. an interferometric device, linear encoder or capacitive sensor), the substrate table WT can be moved accurately, e.g. so as to position different target portions C in the path of the radiation beam PB. Similarly, the first positioner PM and another position sensor IF1 can be used to accurately position the mask MA with respect to the path of the radiation beam PB, e.g. after mechanical retrieval from a mask library, or during a scan. In general, movement of the mask table MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the mask table MT may be connected to a short-stroke actuator only, or may be fixed. Mask MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the mask MA, the mask alignment marks may be located between the dies.

The depicted apparatus could be used in at least one of the following modes:

1. In step mode, the mask table MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the mask table MT and the substrate table WT are scanned synchronously while a pattern imparted to the radiation beam is projected onto a target portion C (i.e. a single dynamic exposure). The velocity and direction of the substrate table WT relative to the mask table MT may be determined by the (de-)magnification and image reversal characteristics of the projection system PL. In scan mode, the maximum size of the exposure field limits the width (in the non-scanning direction) of the target portion in a single dynamic exposure, whereas the length of the scanning motion determines the height (in the scanning direction) of the target portion.

3. In another mode, the mask table MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g. having a wavelength of or about 365, 355, 248, 193, 157 or 126 nm) and extreme ultra-violet (EUV) radiation (e.g. having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

Figure 2A:
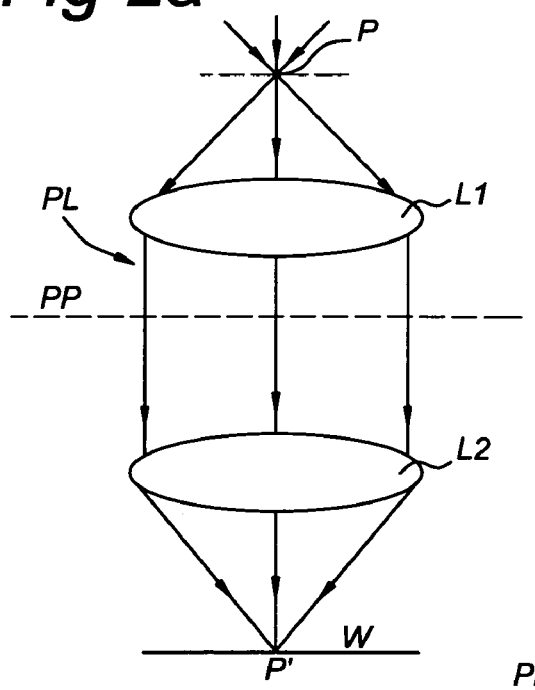
FIGS. 2a and 2b depict a conventional telecentric focus test.
Figure 2B:
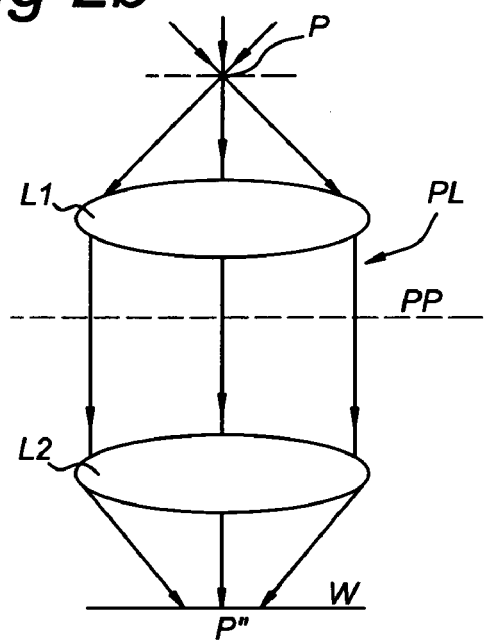

FIGS. 2a and 2b schematically depict a simple and straight-forward prior art focus test. FIG. 2a shows telecentric projection system PL comprising a first lens L1 and a second lens L2. In between the first lens L1 and the second lens L2 is a pupil plane PP. It will be understood that for reasons of simplicity only two lenses are depicted in FIG. 2, but that projection system PL may in general comprise any number of lenses. A test pattern provided on a test device P is imaged via projection system PL on the surface of a substrate W. The test device P may be a test device P being provided on a reticle MA. It may be a test device P that is specially added to the reticle MA for test purposes, but it may also be formed as part of the pattern on the reticle MA used for producing chips. The reticle MA may also be a reticle MA that is specially used for performing focus tests.

In the situation depicted in FIG. 2a, the substrate W is substantially in the focal plane of the projection system PL and test device P is imaged as a sharp test structure P'. FIG. 2b shows the same components, but now substrate W is positioned above the focal plane of the projection system PL. Test structure P is now projected as a blurred test structure P''. It will be understood that the amount of blurring depends on the amount of defocus. However, the amount of blurring does not depend on the direction of the defocus: if substrate W would have been positioned a similar distance below the focal plane of the projection system PL, the same amount of blurring would have been generated. Based on the test structure P'' it is impossible to determine whether the substrate W is above or below the focal plane of the projection system PL.

The amount of blurring can be measured by measuring the width of, for instance, a line of the created pattern after developing using for instance a scanning electron microscope (SEM). Since the behavior of the width with varying defocus is known from a previously obtained bossung curve. This behavior is relatively flat and thus very insensitive for variations in the defocus. The behavior is quadratic, so the sensitivity around best focus is substantially zero.

Figure 3A:
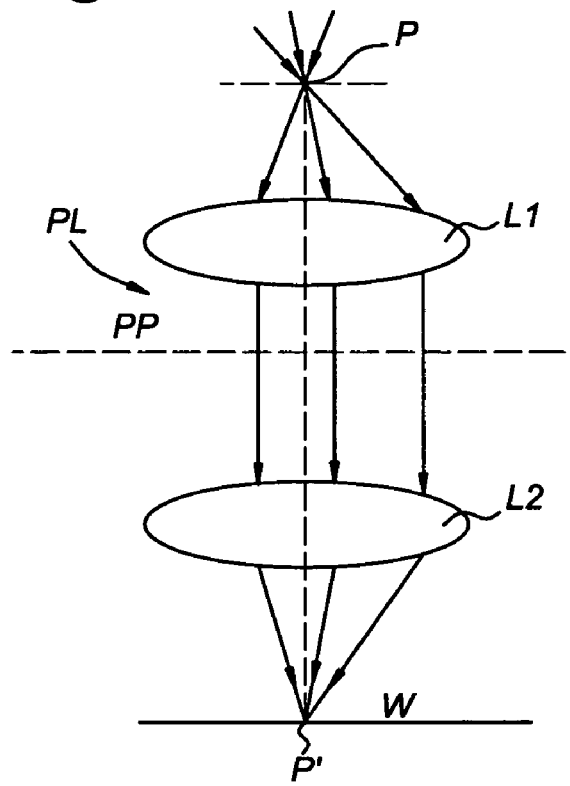
FIGS. 3a and 3b depict a conventional tilted focus test.
Figure 3B:
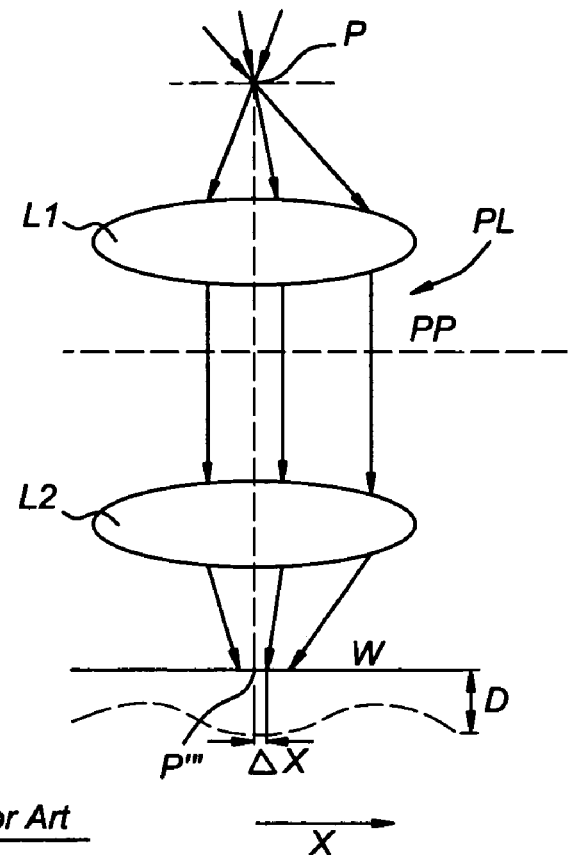

Therefore, tilted focus tests are known, as schematically depicted in FIGS. 3a and 3b. These tilted focus tests guarantee a linear behavior and a sufficiently high sensitivity. The same reference symbols refer to the same items. The image beam used for projecting an image of the test structure provided on the test device P on the surface of the substrate W is now tilted. FIG. 3a shows imaging of a test device P through the projection system PL, where the substrate W is in the focal plane of the projection system PL. FIG. 3b depicts a situation in which the substrate W is above the focal plane of the projection system PL and it can been seen that the test device P is now imaged as a blurred and laterally shifted test structure P'''. The center of the blur P''' is laterally shifted with an amount $\Delta x$ with respect to the position it would have had in case the substrate W would have been in the focal plane of the projection system PL, as depicted in FIG. 3a. As a result, the lateral displacement $\Delta x$ depends on the amount of defocus D. The direction of the lateral shift $\Delta x$ (in the positive or negative x direction) provides information about the direction of the defocus. In case the lateral shift is in the positive x-direction, the substrate W is above the focal plane of the projection system PL, and vice versa. Based on such a tilted focus test it is thus possible to measure and as a further step also correct the relative position of the substrate W and the projection system PL. In principle, it is also possible to adjust the setting of the projection system.

Figure 4:
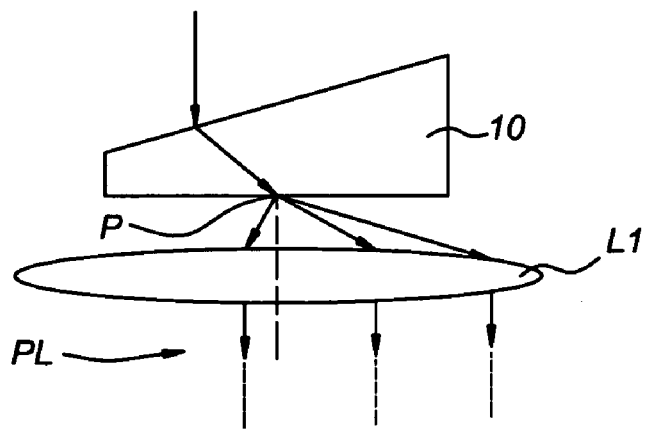
FIG. 4 depicts a conventional wedge for providing a tilted beam.

Several methods are known to create such a tilted beam. FIG. 4 depicts a wedge 10 that provides the image beam with a tilt and shifts the complete intensity distribution. Such a wedge 10 may for instance be made of quartz. The wedge 10 may for instance be positioned on a reticle MA (not shown in FIG. 4) on which the test structure P is positioned.

Figure 5:
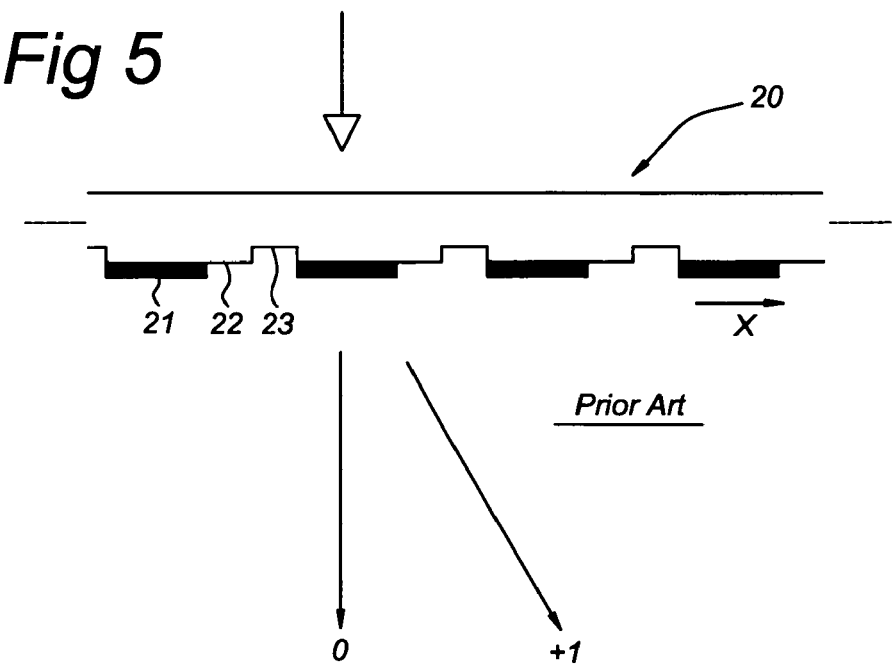
FIG. 5 depicts a conventional pattern for providing a tilted beam.

FIG. 5 depicts an alternative way to create a tilted beam (see also U.S. Pat. No. 6,710,853 B1). FIG. 5 schematically depicts a cross section of a test device 20, for instance made of quartz. The focus test device 20 has a pattern with chrome parts 21, that block impinging light. In between the chrome parts 21, a phase step is etched in the quartz. This phase step is formed by a first part 22 and a second part 23. The height of the first part 22 relative to the height of the second part 23 is chosen such that a phase shift of 90° is provided at the used wavelength. As a result, light that passes through the first part 22 has a 90° phase difference with respect to light that passes through the etched second part 23. The lengths in the x-direction of the chrome parts 21, the first parts 22 and the second parts 23 are in a proportion of 2:1:1, for example.

Light that passes through the test device 20 is diffracted. It can be shown that the wave fronts of the minus first orders resulting from the first part 22 and the second part 23 have a 180° phase difference and cancel each other. The zero orders have 45° phase difference and are slightly weakened, while the plus first orders have a 0° phase difference. Therefore, only the zero and the plus first order are present, while the minus first order is not present. This also results in a tilted beam that can be used for performing tilted focus test.

It will be understood by a person skilled in the art that the solutions described with reference to FIGS. 4 and 5 can not easily be adopted for use in EUV applications. Wedge 10, for instance made of quartz, cannot be used for EUV application since it does not pass EUV radiation. The test device 20 as depicted in FIG. 5 is of a transmissive type, and is therefore also unsuitable for use in EUV applications. In principal, it could be possible to create a reflective version of the test device 20. However, since the wavelength of EUV is rather small (for instance 13 nm), the 90° phase step should be obtained by providing a height difference in the focus test pattern of 13/8 nm for a reflective mask, which requires an accuracy in the manufacture of the test device that is rather difficult to obtain. US2002/0015158 A1 describes a different way of performing a tilted focus test, i.e. by providing one or two blocking members in the illumination system. However, this approach has a number of disadvantages as already discussed above.

Embodiment 1

FIG. 6 shows a projection apparatus comprising a radiation system 2, an illumination optics unit 4, and projection system PL. The radiation system 2 comprises radiation source LA which may be formed by a discharge plasma. EUV radiation may be produced by a gas or vapor, such as Xe gas or Li vapor in which a very hot plasma is created to emit radiation in the EUV range of the electromagnetic spectrum. The very hot plasma is created by causing a "partially ionized" plasma of an electrical discharge to collapse onto an optical axis O. Partial pressures of e.g. 10 Pa of Xe or Li vapor or any other suitable gas or vapor may be used for efficient generation of the radiation. The radiation emitted by radiation source LA is passed from a source chamber 7 into a collector chamber 8, e.g. via a gas barrier structure or contamination trap 9 (which is positioned in or behind an opening in source chamber 7). The gas barrier structure 9 may comprise a channel structure such as, for instance, described in detail in European patent application EP 1 057 079 or EP 1 223 468, which are incorporated herein by reference.

The collector chamber 8 comprises a radiation collector 10 which may be formed by a grazing incidence collector. Radiation passed by collector 10 is reflected off a grating spectral filter 11 to be focused in a virtual source point 12 at an aperture in the collector chamber 8. From collector chamber 8, a projection beam 16 is reflected in illumination optics unit 4 via normal incidence reflectors 13, 14 onto reticle or mask MA positioned on a support structure, such as a reticle or mask table MT. A patterned beam 17 is formed which is imaged in projection system PL via reflective elements 18, 19 onto wafer stage or substrate table WT. More elements than shown may generally be present in illumination optics unit 4 and projection system PL. For instance, a EUV lithographic apparatus may have nine reflective elements, two in the illumination system IL, six in the projection system PL, and finally reflecting mask MA.

FIGS. 7a and 7b depict a projection apparatus according to an embodiment of the invention and show an enlarged detail of FIG. 6. The projection apparatus according to FIGS. 7a and 7b further comprises a tilting device 100 arranged to tilt the reticle or mask MA. The reticle or mask MA is suitable to be used in EUV applications, and may also be referred to as a reflective device, serving to impart the projection beam with a pattern in its cross-section.

The tilting device 100 may be arranged to directly tilt the reflective device, but may also be arranged to tilt the support structure, such as the reticle or mask table MT. The support structure will further be referred to as mask table MT and the reflective device will further be referred to as reflective mask MA. As a result thereof, the reflective mask MA (not shown) positioned on the mask table MT can be tilted. The tilt of the mask table MT and the reflective mask MA is performed about a rotation axis (not shown) that is perpendicular to the plane of the drawing.

The tilting device is here depicted as a square box, but a person skilled in the art will realize how such a tilting device can be constructed. For instance, according to the state of the art, the mask table MT may be provided with actuators, arranged to adjust the orientation of the mask table MT in six degrees of freedom. Other, equivalent constructions known to persons skilled in the art could be applied instead.

The tilting device 100 can be controlled by an electronic control unit ECU. This electronic control unit ECU may be a computer arrangement, such as a central computer arrangement controlling the projection apparatus, but may also be a separate electronic control unit ECU, receiving instructions from such a central computer arrangement. The communication between the electronic control unit ECU and the tilting device and/or the central computer arrangement may be performed wirelessly.

FIG. 7a depicts the tilting device 100 and the mask table MT in a non-tilted position. FIG. 7b shows the tilting device 100 and the mask table MT in a tilted position. For reasons of clarity, in FIG. 7b the tilting device 100, the mask table MT and the patterned beam 17 are also depicted in the non-tilted position (dashed lines).

FIGS. 7a and 7b further show the projection beam 16 that is reflected in the illumination optics unit 4 via normal incidence reflectors 13, 14 (not shown in FIGS. 7a and 7b) onto reflective mask MA (not shown) positioned on mask table MT.

If the mask table MT is not tilted, the projection beam 16 is reflected by the reflective mask MA and a first patterned beam 17 is formed which is imaged in projection system PL via reflective elements 18, 19 onto wafer stage or substrate table WT. The first patterned beam 17 is identical to the patterned beam 17 as shown in FIG. 6.

It is noted that the first patterned beam 17 is in fact a tilted beam, as can be seen in FIG. 7a. This is due to the layout of the projection system PL. However, based on this single first patterned beam 17, no tilted defocus test can be performed. In order to perform a defocus test, i.e. to determine a lateral shift of a projected patterned beam at the level of the substrate table WT, a reference is needed, as is already explained above. This reference is provided by using the tilting device 100 to create a single patterned beam that has a substantially different tilt than the first patterned beam, as will be explained with reference to FIG. 7b.

If the mask table MT is tilted into a tilted position by the tilting device 100, the projection beam 16 is reflected by the tilted reflective mask MA (not shown) and a second tilted patterned beam 17' is formed which is also imaged in projection system PL via reflective elements 18, 19 onto wafer stage or substrate table WT.

Because of the tilting device 100, a first and a second patterned beam 17, 17' can be created, the first and second patterned beam 17, 17' having different tilt values, i.e. the first and second patterned beam 17, 17' being tilted with respect to each other. This difference in tilt can be used to perform a defocus test as will be explained below, with reference to FIGS. 8a, 8b, 8c and 8d.

Figure 8A:
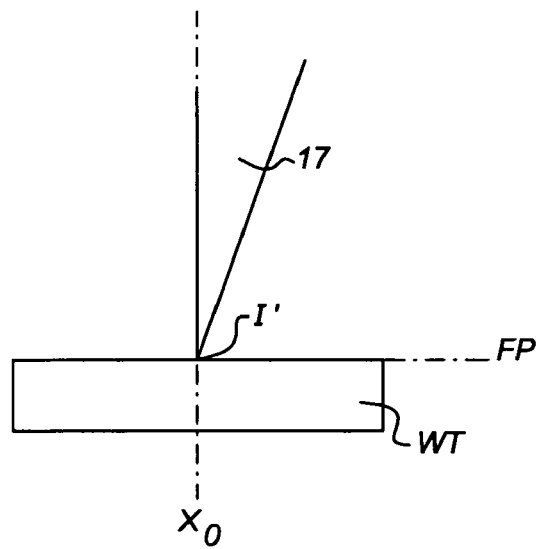

FIG. 8a shows imaging of, for instance, a test device I (not shown) using a first patterned beam 17. Such a test device I may be a reflective mask MA, but may also be a part of a reflective mask, such as a marker. The substrate table WT is positioned such that the substrate W (not shown) is in the focal plane FP of the projection system PL. As a result, the test device I is imaged as a sharp image I' at a position $x_0$. The focal plane FP is the plane of best focus.

Figure 8B:
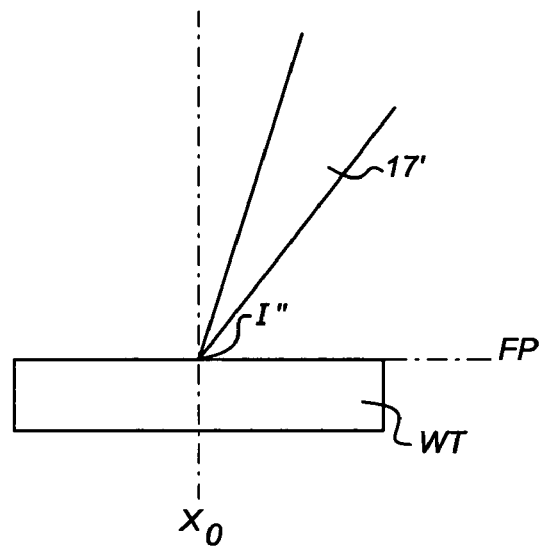

FIG. 8b shows the same situation, but now using a second, tilted patterned beam 17'. Again, the test device is imaged as a sharp image I'' at a position $x_0$.

Figure 8C:
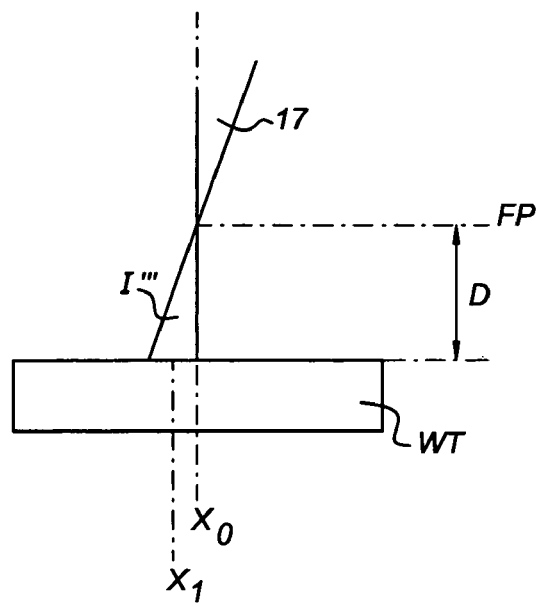

FIG. 8c shows imaging of the test device I using a first patterned beam 17, i.e. no special tilt is given to the patterned beam 17. The substrate table WT is positioned a distance D below the focal plane FP. As a result, the test device I is imaged as a blurred image I''' at a position $x_1$. The position $x_1$ of this blurred image I''' is different from the position $x_0$ of the sharp image I', I''.

Figure 8D:
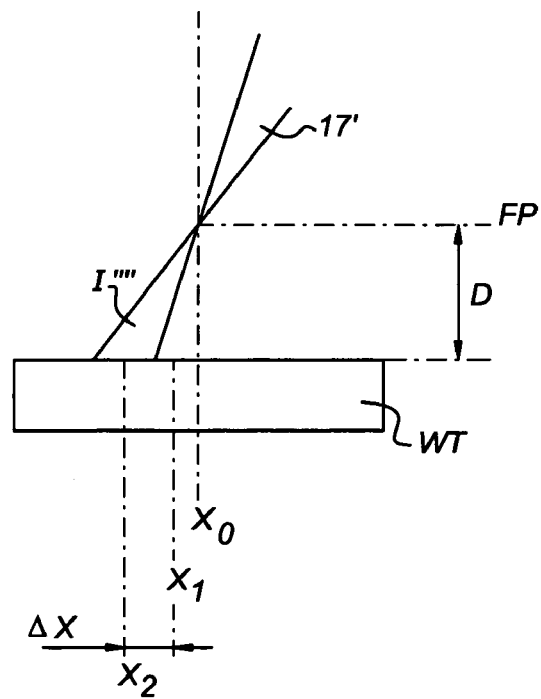

Finally, FIG. 8d shows imaging of the test device I using a second patterned beam 17'. The substrate table WT is positioned a distance D below the focal plane FP. As a result, the test device I is imaged as a blurred image I'''' at a position $x_2$. The position $x_2$ of this blurred image I'''' is different from the position $x_0$ of the sharp image I', I'', and is also different from the position $x_1$ of the blurred image I''' shown in FIG. 8c.

It will be understood that the amount of lateral shift $x_1$, $x_2$ of the images is directly proportional to the amount of defocus D. The defocus D is the distance substantially in the direction of the patterned beam 17, 17' at which the substrate W is positioned away from the focal plane FP. If the substrate W is positioned below the focal plane FP, as depicted in FIGS. 8c and 8d, the lateral shift $x_1$, $x_2$ of the images is in a first direction (left according in the situation depicted in FIGS. 8c and 8d). If the substrate W is positioned above the focal plane, the lateral shift $x_1$, $x_2$ of the images is in an opposite second direction.

The position of the images I', I'', or the average position of blurred imaged I''', I'''' may for instance be determined by using a scanning tunneling microscope (SEM) or any other suitable apparatus can be used. The appropriate way to determine the position depends on the test feature which is used.

As can be seen in FIGS. 8c and 8d, the lateral shift $x_1$, and the lateral shift $x_2$ have different values for different values of the defocus D. Only in the case that the defocus D equals zero, both lateral shifts $x_1$, $x_2$ equal zero. The difference between these two values, the relative position $\Delta x$ ($\Delta x = x_1 - x_2$) can now be used as a measure for determining the amount of defocus D.

Several ways of measuring the position of a blurred image can be applied, for instance, the middle of the blurred image can be measured. Another advantageous method is to determine the 'center of gravity' of the feature, as will be understood by a skilled person.

When determining the amount of defocus, a test device I is first imaged using a first patterned beam 17, and subsequently using a second patterned beam 17', which is given a specific tilt with respect to the first patterned beam 17. In a next step, the relative position $\Delta x$ of the two images is determined. The sign of $\Delta x$ gives information about the sign of the defocus D (above or below the focal plane FP) and the absolute value $|\Delta x|$ provides information about the amount of defocus D. Based on this, the position of the substrate table WT can be adjusted to position the substrate W in the focal plane FP. Also other actions can be taken to improve the focus, such as adjusting the setting of the projection system PL.

It will be understood that for performing this method, first a calibration graph or table should be determined, from which the value and sign of D can be determined based on the determined value and sign of $\Delta x$.

A calibration graph can be obtained by performing a sequence of focus test measurements as described above, while varying the defocus. Measurements can be done with a defocus say of $-0.300\,\mu m$, $-0.150\,\mu m$, $+0\,\mu m$, $+0.150\,\mu m$ and $+0.300\,\mu m$. For each value of the defocus D, the relative position $\Delta x$ is determined. The lateral shift is determined using techniques referred to above. Due to the tilt of the measurement beam, the behaviour of the lateral shift with focus will be mainly linear.

As a result of lens aberrations, the ideal focal plane FP may be different for a test device $I_x$ having a pattern formed in the x direction (e.g. a grating having lines that extend in the y direction, being substantially perpendicular to the x direction), than for a test device $I_y$, having a pattern formed in the y direction. The defocus method as described above may therefore be performed for the x and y direction.

Since the method as described here could be used to determine the defocus in x and y direction, it will be understood that also lens aberrations could be derived from this. For instance, based on the determined defocus in the x and y direction astigmatism and, e.g. astigmatism curvature which may be corrected for in the projection system PL can be obtained.

After the calibration curve is determined, the calibration curve can be used to determine the focus of imaged test devices. The calibration curves may be used for focus tests performed thereafter. The obtained calibration curve can be used if the following conditions are met:

1) the lithographic projection apparatus keeps stable, otherwise recalibration is needed after a certain time period, and 2) conditions remain the same as during calibration (same resist, illumination settings etc.).

The calibration curve may be used for performing actual focus tests according to the invention. The focus test according to the invention may be performed on the entire surface of a substrate W, but may also be used to determine the focus on specific areas of the substrate W (e.g. scribe lanes).

The focus test may be used to test the focus on the entire surface of a substrate W. This may be done by printing test patterns to the entire layer of resist provided on the substrate W while positioning the substrate W according to a height map obtained by a level sensor. Such a height map comprises information about the height of the substrate W on different x,y locations on the substrate W. Based on such a determined height map, an optimal position of the substrate W with respect to the projection system PL is computed.

Since the substrate W is not a flat object but has all kinds of local deformations, it is impossible to have the entire exposure area within the focal plane.

The actual obtained focus can be determined by projecting test patterns provided on test devices to the entire substrate. After the substrate W is exposed and the test patterns are developed, the actual obtained focus can be determined and a focus map can be generated from the entire substrate surface. Such a focus map comprises data representing the actual obtained (de-)focus on different x,y locations on the substrate W. This is done by measuring the lateral shift of each printed test pattern using known techniques and determining the defocus D.

After this, the resist can be removed and a new layer of resist can be applied to the substrate W (non destructive), which can be used for exposing the actual pattern on the substrate W. The obtained focus map can then be used to more accurately project the actual pattern to the substrate W.

However, in an alternative embodiment, the test pattern provided on the test device is projected on scribe lanes. These scribe lanes are outside the target portions C on which the actual product patterns are printed. This technique allows a combination of "real" exposure and monitoring at the same time and there is no need to remove the resist as in the example above.

In both cases, the test pattern provided on the test device is imaged in the layer of resist, and next the substrate W is removed from the lithographic apparatus and transported into a track. Inside the track, the printed test patterns, that are still latent, are made detectable, for instance by performing a post exposure bake. After this, the lateral shift of the printed test patterns is determined, using known techniques.

The method and apparatus described herein provide an advantage that a tilted defocus test can be performed relatively easily and fast.

Embodiment 2

According to the first embodiment, the first and the second patterned beam 17, 17' project the images such that they at least partially overlap. Determining the relative shift of overlapping projected test devices is a rather difficult procedure. Two relatively shifted lines that are projected on top of each other may result in one single broader line. It is difficult to distinguish the change of line width due to the actual focus conditions and other effects, such as processing, dose variations etc.

Therefore, the projection of the first and second patterned beam 17, 17' can be positioned at a predetermined offset distance with respect to each other. It is advantageous to provide the two projections with an offset $x_{offset}$, as shown in FIG. 9. The test device I is imaged using the first patterned beam 17 at a first position $x_1$, and is imaged using the second pattern beam 17' at a second position $x_2$. If the substrate W is in the focal plane, the distance between the first and second position equals $x_{offset}$ ($x_{offset} = x_1 - x_2$).

In case the substrate W is not positioned in the focal plane, as depicted in FIG. 9, both the first and second images I''', and I'''' are shifted laterally. However, the lateral shift of both images is different, and thus, again $\Delta x$ can be computed: $\Delta x = x_1 - x_2 - x_{offset}$.

By providing an offset, the images I''', I'''' do not overlap, and thus, their positions can be determined in a more accurate and easy way.

Embodiment 3

In a further embodiment, the accuracy and sensitivity of the determined $\Delta x$ and thus of the defocus D can be increased. This is done by using the test device to provide the first patterned beam 17 with a tilt in a direction opposite to the direction of the second patterned beam 17'. This is depicted in FIG. 10.

Using the tilting device 100, the patterned beam 17 can be given an appropriate tilt. According to the embodiment described with reference to FIG. 10, the first patterned beam 17 is given a tilt in a first direction with respect to a non-tilted beam. The term non-tilted beam as used here to denote a patterned beam 17 as depicted in FIG. 6, in the case the mask MA is not provided with a specific tilt. The second patterned beam 17' is given a tilt in a second direction, being opposite to the first direction. The first and second tilt may have a similar value with opposite signs, but may also have different values.

According to the embodiment in FIG. 10, the first and second image I''', I'''' may be given an offset $x_{offset}$ with respect to each other as described in embodiment 2. It will be understood that this offset may also be zero, as in embodiment 1, discussed with reference to FIGS. 8a, b, c and d.

Embodiment 4

According to a further embodiment, the tilt may also be provided by one of the other optical elements provided, as for instance shown in FIG. 6. The tilt may be introduced by providing a tilting device 100 to tilt normal incidence reflectors 13, 14 positioned in illumination optics unit 4. Also, reflective elements 18, 19 provided in projection system PL may be tilted to create a tilted patterned beam.

The optical element tilted is preferably in an image plane of the patterned beam. Also optical elements that are not in an image plane may be used. However, tilting optical elements not being in an image plane, will introduce additional aberrations. Such aberrations may need to be corrected for.

Embodiment 5

According to a further embodiment, the patterned beam 17 is provided with a tilt in a different way as described above. Instead of using a tilting device 100 for tilting for instance the mask MA, a wedge shaped mask MA' may be used. FIG. 11 schematically depicts a projection beam 16 being reflected by a mask MA' positioned on a mask table MT. Dashed lines are used to indicate a normal flat mask table MT and mask MA, generating a first patterned beam 17.

In order to create a tilted beam to perform a tilted focus test, a wedge shaped mask MA' may be used, generating a second patterned beam 17' being tilted with respect to the first patterned beam 17. This is shown in FIG. 11.

Such a wedge shaped mask MA' provides a simple way of creating a tilted patterned beam 17' for performing a tilted focus test. A tilted focus test may be performed by first imaging a test pattern using a normal flat mask MA, and secondly, using a wedge shaped mask MA'. Of course this embodiment may be combined with all kinds of techniques and variations described above, such as providing an offset between the first and second patterned beam 17, 17', or by providing both the first and second patterned beams 17, 17' with a tilt in opposite directions to increase the accuracy. The latter may be done by using two wedge shaped masks MA' having opposite tilts. It may also be done using one wedge shaped mask MA' and rotating it 180° in between a first and second exposure.

FIG. 12 depicts an example of a wedge shaped mask MA', having a tilted reflective surface. The mask MA' is wedge shaped, having a tilt in the y direction. The x, y and z directions are indicated in the drawing.

FIG. 13 depicts another example of a wedge shaped mask MA". This wedge shaped mask MA" is provided with a tilt in two substantially perpendicular directions: the x and y direction. The vertically drawn edges of the wedge shaped reticle have respective lengths of z1, z2 and z3, where z1<z2<z3. According to the depicted embodiment, two diagonally opposite edges both have a length of z2. However, these two edges may also have different lengths.

The side of the mask MA" depicted as top side may be the patterned side, reflecting projection beam 16.

Such a wedge shaped mask MA" both generates patterned beam 17' having a tilt in the x and y directions. The wedge shaped mask MA" may therefore be used to determine a shift of the projected test pattern in both the x and y directions in one go. Such a wedge shaped mask MA" may therefore be used to determine astigmatism caused by lens aberrations.

Based on the determined lateral shifts in the x and y directions, the relative position of the target object may be adjusted with respect to the projection beam. In order to do this, the average of the lateral shift in the x direction and the y direction may be used.

Of course, instead of using a wedge-shaped mask, a wedge-shaped mask table MT may be used.

Also, instead of using a wedge-shaped mask, also one of the other optical elements may be replaced with a wedge-shaped optical element. The tilt may be introduced by providing a wedge-shaped optical element to replace normal incidence reflectors 13, 14 positioned in illumination optics unit 4. Also, reflective elements 18, 19 provided in projection system PL may be replaced with a wedge-shaped reflective element.

The tilted optical element is preferably in an image plane of the patterned beam. Also optical elements that are not in an image plane may be used. However, tilting optical elements not being in an image plane, will introduce additional aberrations. Such aberrations may need to be corrected for.

While specific embodiments of the invention have been described above, it will be appreciated that the invention may be practiced otherwise than as described. For example, the invention may take the form of a computer program containing one or more sequences of machine-readable instructions arranged to control movement of the mask or reticle table MT (or mask or reticle MA directly) to perform a method as disclosed above, or a data storage medium (e.g. semiconductor memory, magnetic or optical disk) having such a computer program stored therein.

The descriptions above are intended to be illustrative, not limiting. Thus, it will be apparent to one skilled in the art that modifications may be made to the invention as described without departing from the scope of the claims set out below.

I claim:

1. A method for performing a tilted focus test, comprising:
providing a target object;
providing a projection beam of radiation using a radiation source;
producing a first projected projection beam of radiation onto the target object using a first reflective device in a first orientation;
producing a second projected projection beam of radiation onto the target object using a second reflective device in a second orientation having a tilt with respect to the first orientation;
determining a lateral shift of the first and second projected projection beams on the target object; and
determining from said lateral shift a defocus of the target object with respect to the first and second projected projection beam.

2. The method according to claim 1, wherein the first reflective device is a wedge shaped reflective device.

3. The method according to claim 1, wherein the second reflective device is a wedge shaped reflective device.

4. The method according to claim 1, wherein at least one of the first reflective device and the second reflective device is provided with a pattern to impart the projection beam with a pattern in its cross-section for creating a first and second patterned beam.

5. The method according to claim 1, wherein the first and the second projected projection beam are projected onto the target object at a predetermined offset distance with respect to each other and the lateral shift is determined with respect to the offset distance.

6. The method according to claim 1, wherein the first projected projection beam is provided with a first tilt and the second projected projection beam is provided with a second tilt, the first and the second tilt having an opposite sign with respect to a non-tilted projection beam.

7. The method according to claim 1, further comprising:
adjusting a relative position of the target object with respect to the projection beam based on the determined defocus of the target object.

8. The method according to claim 1, wherein the target object is a substrate used in lithographic techniques and the method further comprises:
subjecting the substrate to a post exposure treatment before determining the lateral shift of the first and the second projected projection beam.

9. The method according to claim 1 wherein said target object is a semiconductor substrate.

10. An exposure apparatus, comprising:
a table that holds a target object;
a radiation source that provides a projection beam of radiation;
a first reflective device oriented in a first orientation to produce a first projected projection beam of radiation onto the target portion;
a second reflective device oriented in a second orientation to produce a second projected projection beam of radiation onto the target portion, the second orientation having a tilt with respect to the first orientation;
an electronic control unit that determines a lateral shift of the first and second projected projection beams on the target object and determines, from said lateral shift, a defocus of the target object with respect to the projected projection beam.

11. The exposure apparatus according to claim 10, wherein the first reflective device is a wedge shaped reflective device.

12. The exposure apparatus according to claim 10, wherein the second reflective device is a wedge shaped reflective device.

13. The exposure apparatus according to claim 10, wherein at least one of the first reflective device and the second reflected device is provided with a pattern that imparts the projection beam with a pattern in its cross-section for creating a first and second patterned beam.

14. The exposure apparatus according to claim 10, further comprising reflective elements for projecting the first and second projection beams onto the target object.

15. The exposure apparatus according to claim 10, wherein the exposure apparatus is a lithographic apparatus and the target object is a semiconductor substrate.

16. The exposure apparatus according to claim 10, wherein the first and the second projected projection beam are projected onto the target object at a predetermined offset distance with respect to each other and the lateral shift is determined with respect to the offset distance.

17. The exposure apparatus according to claim 10, wherein the first projected projection beam is provided with a first tilt and the second projected projection beam is provided with a second tilt, the first and the second tilt having an opposite sign with respect to a non-tilted projection beam.

18. A method for performing a tilted focus test, comprising:
   providing a target object;
   providing a projection beam of radiation using a radiation source;
   producing a first projected projection beam of radiation onto the target object using a reflective device in a first orientation;
   producing a second projected projection beam of radiation onto the target object using the reflective device in a second orientation having a tilt with respect to the first orientation;
   determining a lateral shift of the first and second projected projection beams on the target object; and
   determining from said lateral shift a defocus of the target object with respect to the first and second projected projection beam.

19. The method according to claim 18, wherein the reflective device is rotated 180 degrees between the first and second orientations.

20. An exposure apparatus, comprising:
   a table that holds a target object;
   a radiation source that provides a projection beam of radiation;
   a reflective device configured to be oriented in a first orientation to produce a first projected projection beam of radiation onto the target portion, and to be oriented in a second orientation to produce a second projected projection beam of radiation onto the target portion, the second orientation having a tilt with respect to the first orientation; and
   an electronic control unit that determines a lateral shift of the first and second projected projection beams on the target object and determines, from said lateral shift, a defocus of the target object with respect to the projected projection beam.

21. The exposure apparatus according to claim 20, wherein the reflective device is rotated 180 degrees between the first and second orientations.

* * * * *